350-96.11
9/5/78    XR    4,112,389

United States Patent [19]
Streifer et al.

[11]  4,112,389
[45]  Sep. 5, 1978

[54] DIODE LASER WITH RING REFLECTOR

[75] Inventors: William Streifer, Palo Alto; Donald R. Scifres; Robert D. Burnham, both of Los Altos, all of Calif.

[73] Assignee: Xerox Corporation, Stamford, Conn.

[21] Appl. No.: 761,110

[22] Filed: Jan. 21, 1977

[51] Int. Cl.² .............................................. H01S 3/19
[52] U.S. Cl. ........................... 331/94.5 H; 350/96.11; 357/18
[58] Field of Search ...................... 331/94.5 H, 94.5 C; 350/96 WG, 96.11; 357/18

[56] References Cited
U.S. PATENT DOCUMENTS
3,605,037  9/1971  D'Asaro ......................... 331/94.5 H OTHER PUBLICATIONS
Elsa Garmire, "Moving Toward Integrated Optics", *Laser Focus,* Oct. 1975, pp. 55–59.

*Primary Examiner*—Stanley D. Miller, Jr.
*Assistant Examiner*—James W. Davie
*Attorney, Agent, or Firm*—James J. Ralabate; Sheldon F. Raizes; Leonard Zalman

[57] ABSTRACT

A diode laser having an active region which has a section in the shape of a closed loop or ring, with the path length of the loop or ring causing a light wave traveling completely around the loop or ring section from a coupler section of the active region to undergo a phase shift of 180° relative to its starting phase whereby the two waves interfere destructively, and thus provide optical feedback.

4 Claims, 6 Drawing Figures

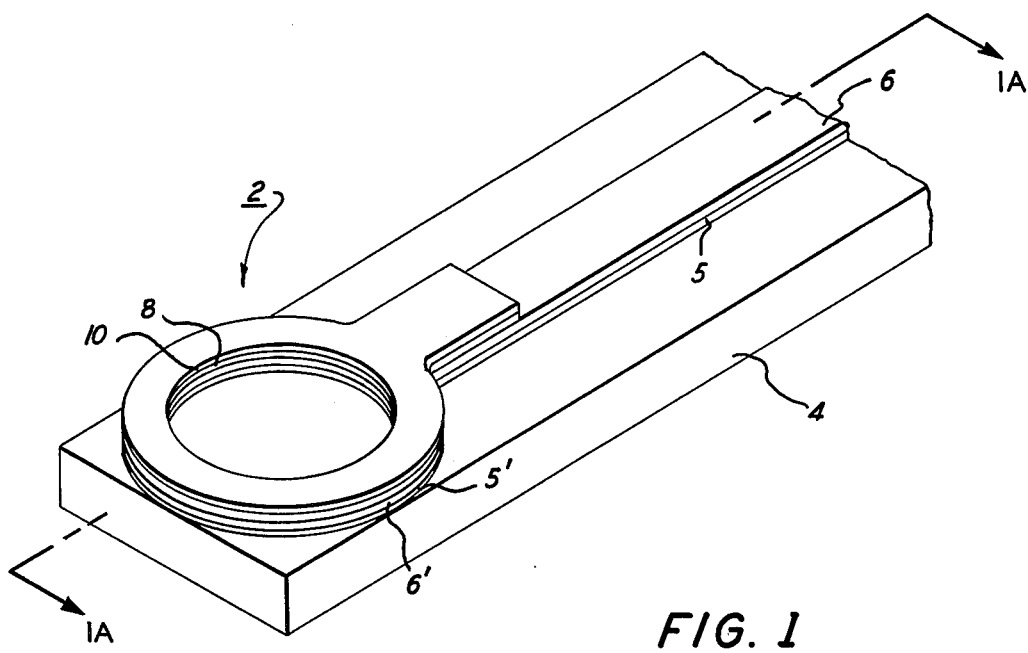
FIG. 1
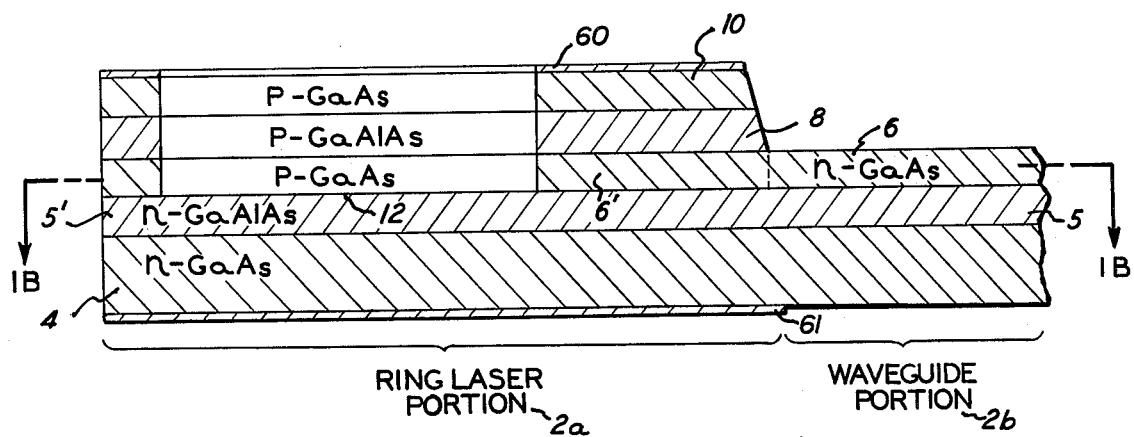
FIG. 1A
FIG. 1B

DIODE LASER WITH RING REFLECTOR

BACKGROUND OF THE INVENTION

The semiconductor diode laser in a p-n junction device which lases when a forward bias voltage of at least 1.5 volts is applied to the device. The voltage drives either holes or electrons or both across the p-n junction and when the holes and electrons recombine they emit light. For an instant before the holes and electrons recombine, they can be "stimulated" by light to emit more light coherently. This stimulated emission phenomenon is equivalent to providing amplification and is related to the first of two requirements for laser oscillation. Specifically, a first requirement is that there be sufficient gain or amplification of the light within the laser to overcome all losses. The second requirement for laser oscillation is an optical feedback mechanism. Optical feedback is provided in conventional diode lasers by simply "cleaving" the faces of the semiconductor crystal. These cleaves form plane parallel mirror-like surfaces which reflect a portion of the light back into the region of the p-n junction. The reflected light is amplified and the energy density within the laser continues to build up to produce the very intense laser beam.

Several problems have thus far tended to reduce the usefulness and versatility of the described "cleaved-faced" diode laser. First, these diode lasers often fail within tens to hundreds of hours of usage because of damage caused by the high intensity of the light incident on the cleaved mirrors. Secondly, and equally important, no means is known for integrating these diode lasers into an integrated optical system.

In patent application Ser. No. 761,105 filed Jan. 21, 1977 by the inventors of the subject application and entitled SEMICONDUCTOR LIGHT REFLECTOR/LIGHT TRANSMITTER, there is described a semiconductor device which is coupled by a waveguide structure to a diode laser source and which operates on interferometric principles to provide either light reflection or transmission and light amplitude modulation. That device provides a means of integrating a diode laser into an integrated optical circuit and has the advantage of electrical control which is not possessed by distributed feedback laser devices. However, it would be desirable to have an interferometric reflector as part of the laser active region so that the optical feedback mechanism is incorporated directly into the laser structure.

OBJECTS OF THE INVENTION

It is an object of the present invention to provide an improved diode laser.

It is a further object of the present invention to provide a diode laser having an integral interferometric reflector.

SUMMARY OF THE INVENTION

In accordance with the invention, a diode laser is provided which uses light wave interference to provide the optical feedback mechanism for the laser. The pumped active region of the laser includes a section in the shape of a closed loop or ring which closes at a coupler section of the active region. The path length of the closed loop or ring section is chosen so that a light wave beginning at the coupler section and traveling around the loop or ring section experiences a path length difference of $\lambda_g/2$ when it arrives back in the coupler section. The two waves then interfer destructively and no power is transmitted into a waveguide connected to the coupler section. This means that the light wave that traversed the loop or ring section is reflected back into the loop or ring and thus optical feedback is provided without cleaved end faces or a distributed feedback structure. For high reflectance a 3db coupler is preferred.

The loop or ring shaped section of the laser active region can have two couplers connected on opposite sides thereof. These couplers also reflect light at certain wavelengths due to interference phenomena, thus providing feedback. Depending on the symmetry of the couplers, the light output (or reflection) at the couplers can vary whereby light can be transmitted to a desired waveguide coupled to one of the couplers.

BRIEF DESCRIPTION OF THE DRAWINGS

FIGS. 1, 1A and 1B show one form of semiconductor device in accordance with the invention.

DETAILED DESCRIPTION OF THE INVENTION

Figure 2:
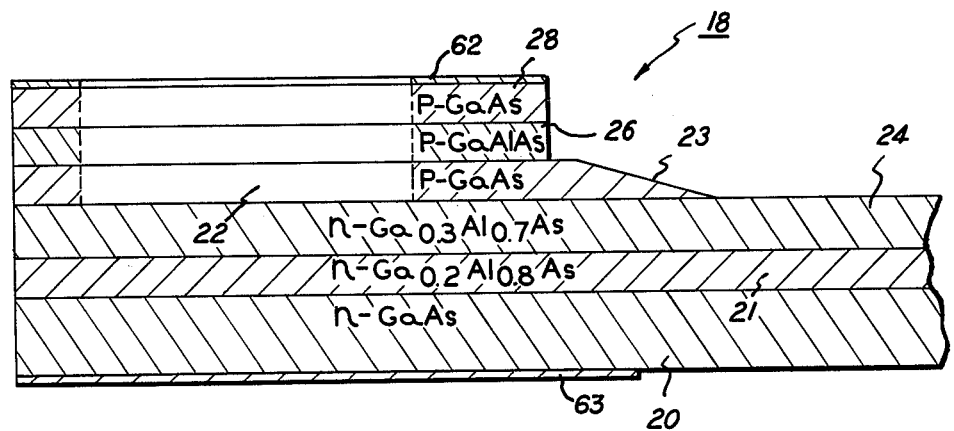
FIG. 2 shows in cross-section another form of semiconductor device in accordance with the present invention.

Referring now to FIGS. 1, 1A and 1B there is shown an embodiment of a semiconductor device 2 which utilizes destructive interference between light waves to provide an optical feedback mechanism. Semiconductor device 2 includes substrate 4 and layers 5, 6, 8 and 10, and is divided into a ring laser portion 2a and a waveguide portion 2b. Ring laser portion 2a includes a portion of substrate 4, a portion 5' of layer 5, a portion 6' of layer 6, and layers 8 and 10. Portion 6', which constitutes the active region of the ring laser, includes a closed loop or ring-shaped section 6a which closes at a 3db coupler section 6b. The 3db coupler section 6b connects the ring-shaped section 6a of the ring laser 2a to the waveguide section 6c of the waveguide portion 2b. The layers 5', 8 and 10 have substantially the same shape as the portion 6' of the layer 6, that is, layers 5', 8 and 10 have the shape of a closed loop or ring. The ring laser portion 2a is doped to provide a rectifying (p-n) junction at one surface of the active region portion 6'. With sufficient forward bias of the rectifying junction, carriers are driven across the rectifying junction where they combine with other carriers to emit light.

Layers 5 and 8 are of a material having a lower refractive index than the material of layer 6 to provide for light confinement. Specifically, the semiconductor device 2 can have, for example, the layer compositions and doping types shown in FIG. 1A. That double heterojunction structure provides a rectifying junction 12 between the portion 5' of layer 5 and the portion 6' of layer 6 and light emission when a sufficient forward bias is applied to rectifying junction 12 by electrodes 60 and 61. If the light generated in the portion 6' of layer 6 remains in the material from which it is generated, it would be absorbed within a short time. Accordingly, if the light generated is to propagate in waveguide section 6c of layer 6, the waveguide section 6c must have a different band gap than light generating and coupler sections 6a and 6b of layer 6. That difference in band gap can be achieved by having the section 6c doped oppositely to sections 6a and 6b, as shown in FIG. 1A. As is explained in the cited concurrently filed patent application, light can be directed into a waveguide by butt-coupling between an active region of one conductivity type, and a waveguide region of the opposite conductivity type, as described in relation to FIG. 1A, or by alternative structures such as by taper coupling wherein the light emitting region has a tapered portion which directs the emitted light into a layer having a composition different from the composition of the light emitting region, by evanescent wave coupling, or by other means well known in the art.

Optical feedback of the emitted light sufficient to provide lasing is provided by the ring-shaped section 6a and the 3db coupler section 6b of layer 6. By 3db coupler it is meant that the junction of the ring section 6a with the coupler section 6b is a symmetrical junction, that is, a light wave advancing toward the ring section from a point of the coupler section will be divided equally and send light waves of equal intensity around the loop in both directions. Optical feedback sufficient to provide lasing is provided by interfering light waves in the 3db coupler section 6b. If a light wave (of wavelength $\lambda g$), beginning at the 3db coupler section 6b and traveling in either direction around the ring-shaped section 6a, experiences a path length difference of $\lambda g/2$ when it arrives back at its starting point in the 3db coupler section 6b, then the two waves, that is, the portion of the light wave that has traversed or circulated around the ring and the portion of the light wave which has not yet traversed or circulated around the ring, will destructively interfere and no power will be transmitted into the waveguide section 6c. In other words, if the returning light wave has a phase shift of 180° relative to its starting phase, the two waves are out of phase and destructively interfere. The destructive interference causes the circulating light wave to be reflected back into the ring section 6a, thus providing optical feedback. The ring laser 2a will oscillate at wavelengths corresponding to path lengths of $p\lambda + \lambda/2$ where $p$ is an integer because these are the wavelengths at which the destruction (or reflection) is maximum and thus the wavelengths at which the laser threshold is lowest.

Output from the laser into the waveguide can be obtained by use of an assymetrical coupling section (not a 3db coupler). In this case one beam will be more intense than the one travelling in the opposite direction and thus partial reflection (and partial transmission) will be obtained. By varying the coupler geometry the reflection and transmission properties can be optimized for the particular laser and waveguide use.

The semiconductor device of FIG. 1 can be made by conventional liquid phase epitaxy or molecular beam epitaxy growth techniques, and standard photolithographic masking and etching techniques. For example, the layers 5, 6, 8 and 10 can be grown on substrate 4 by conventional liquid phase epitaxial growth techniques, followed by the application of a resist mask, in the shape of a ring section and a straight coupler section, to the top surface of layer 10 and then the application of an acid etch to the top surface of layer 10. The acid etch will remove those portions of the semiconductor material not protected by the resist mask. Alternatively, the semiconductor device of FIG. 1 can be made by growing through a silicon nitride mask having the ring pattern. LPE growth occurs only through the opening in the nitride mask. If MBE is used non-conducting regions are grown over the $Si_3N_4$ portion while conducting regions are produced in the opening. Alternately, layers 5, 6, 8 and 10 may be grown with layer 6 being n-type. Next a $Si_3N_4$ ring shaped mask may be formed and Zn diffused to form p-type region 6'. This process produces both the coupler and ring geometry simultaneously.

The radius of the ring section 6a must be sufficiently large so that radiation losses around the ring are kept within limits that will provide light wave feedback of sufficient intensity to sustain lasing. For example, when the active region layer is adjacent a layer of the same material but different doping type, that is, portion 6' of p-type doping and substrate 4 of n-type doping, the radius of the ring section 6a should be greater than approximately 0.4 millimeters. A smaller ring radius can be provided if the active region layer is sandwiched between layers having a substantially lower refractive index, as is true for a buried heterojunction device or etched mesa device 18 shown in cross section in FIG. 2. Device 18 includes a substrate 20, a layer 21, an active region layer 22, light confining layers 24 and 26 bordering the layer 22, a contact facilitating layer 28 and electrodes 62 and 63. The buried heterojunction or etched mesa device 18, which can be comprised of the materials and doping types shown in FIG. 2, operates on the same principles as the device of FIG. 1, but instead of butt-coupling utilizes a tapering 23 of the 3db coupling section of the active region layer 22 to direct light into a waveguide section provided by layer 24.

Figure 3:
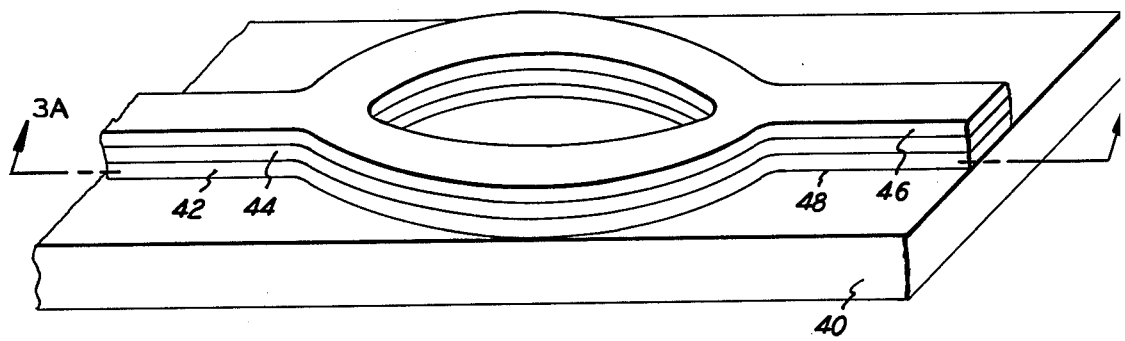
FIGS. 3 and 3A show a semiconductor device in accordance with the invention with multiple waveguide connections.
Figure 3A:
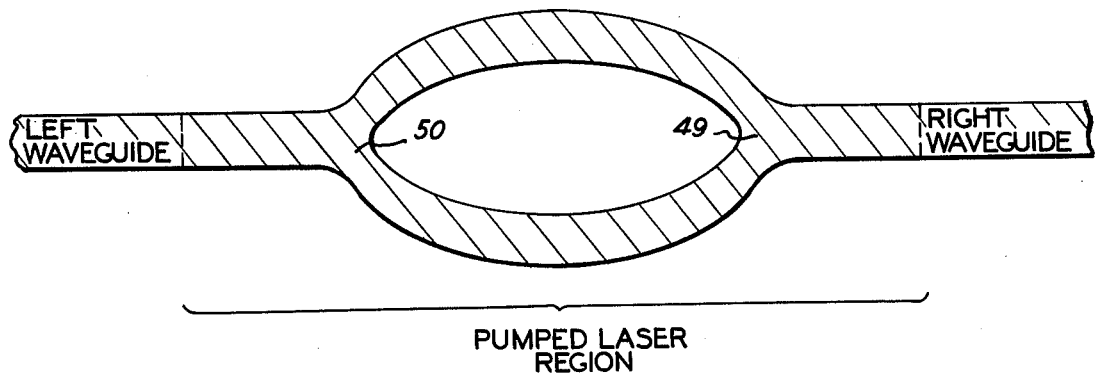

A diode laser capable of directing light waves into more than one waveguide is shown in FIGS. 3 and 3A. The device of FIG. 3 includes a substrate 40, an active region layer 42, a light confining layer 44, a contact facilitating layer 46, and a rectifying junction 48 adjacent the active region layer. As shown in FIG. 3A, the active region layer 42 includes a right waveguide and a left waveguide. The principle of operation of the diode laser of FIG. 3 is identical to that described for the ring lasers of FIGS. 1 and 2 in that the couplers 49 and 50 reflect light at certain wavelengths due to destructive interference phenomena. Thus feedback is provided. Depending on the symmetry of the couplers, the light output (and reflection) can vary from one end to the other.

It should be noted that the ring diode laser of the invention can be either of the homojunction, single heterojunction or of the double heterojunction type. Also, other types of laser geometries can be used. For example, twin guide lasers having separate optical and carrier confinement, and buried heterostructure lasers can also be used. Furthermore, distributed feedback and/or discrete reflectors can be used to replace one of the coupler sections of FIG. 3. Thus, the technique of the invention is extremely versatile, easy to fabricate and readily provides for diode laser integration in an integrated optical system.

What is claimed is:

1. A semiconductor device including:
   a laser portion and a waveguide portion, supported by a substrate,
   said laser portion comprising a plurality of semiconductor layers including a laser active region having a ring-shaped portion and a first coupler portion connected to said ring-shaped portion,
   a rectifying junction between two of said semiconductor layers within said laser portion, means for forward biasing said rectifying junction, carriers injected across said junction upon sufficient forward biasing thereof providing the emission of light waves of wavelength λ, at least a portion of said emitted light waves traveling around said ring-shaped portion of said active region, said ring-shaped portion of said active region having a path length which causes said light waves of wavelength λ to experience a phase shift relative to their starting phase as the light waves travel around said ring-shaped portion from said connection with said first coupler portion and back to said connection whereby, due to the phase difference, the light waves destructively interfere to reflect light back into said ring-shaped portion and into said first coupler portion, and light reflected back into said ring-shaped portion providing the necessary feedback to provide for lasing of said laser portion, and said first coupler portion being coupled to said waveguide portion whereby at least some of the light waves reflected into said first coupler portion propagate into said waveguide portion.

2. The semiconductor device of claim 1 wherein said phase shift is 180°.

3. The semiconductor device of claim 2 wherein said laser portion includes at least one heterojunction.

4. The semiconductor device of claim 2 wherein a second coupler portion is connected to said ring-shaped portion, said second coupler portion being disposed opposite said first coupler position.

* * * * *